United States Patent
Singh et al.

(10) Patent No.: US 7,038,490 B1
(45) Date of Patent: May 2, 2006

(54) DELAY-MATCHED ASIC CONVERSION OF A PROGRAMMABLE LOGIC DEVICE

(75) Inventors: Satwant Singh, Fremont, CA (US); Cyrus Tsui, Los Altos, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 13 days.

(21) Appl. No.: 10/660,814

(22) Filed: Sep. 12, 2003

(51) Int. Cl.
*H01L 25/00* (2006.01)
*H03K 19/177* (2006.01)

(52) U.S. Cl. .............................. 326/41; 326/38; 716/3; 716/5

(58) Field of Classification Search .................. 326/37, 326/38, 39, 40, 41, 47; 716/3, 5, 6
See application file for complete search history.

(56) References Cited

U.S. PATENT DOCUMENTS 5,526,278 A * 6/1996 Powell .......................... 716/16
5,825,202 A * 10/1998 Tavana et al. ................. 326/39
6,211,697 B1 * 4/2001 Lien et al. ..................... 326/41
6,504,398 B1 * 1/2003 Lien et al. ..................... 326/41

OTHER PUBLICATIONS

Altera Hard Copy, Devices for APEX 20K Conversion, Data Sheet, Sep. 2001, ver. 1.0, pp. 1-36.
XPressArray 0.18μ Hybrid Gate Array, AMI Semiconductor, pp. 1-8, no date.
PGA Data Book, Oct. 1996, Masked Array Conversion For ORCA ("MACO"), Lucent Technologies Inc., p. 7-7.

* cited by examiner

*Primary Examiner*—Daniel D. Chang
(74) *Attorney, Agent, or Firm*—Jonathan W. Hallman; MacPherson Kwok Chen & Held

(57) ABSTRACT

An ASIC conversion of a programmable logic device (PLD) is provided. The PLD includes a plurality of logic blocks coupled together by a PLD routing structure. The ASIC includes a plurality of logic blocks corresponding on a one-to-one basis with logic blocks in the PLD and a routing structure corresponding to the programmable routing structure of the PLD. Vias or traces are selectively placed in the ASIC so that logical behavior of its logic blocks matches that implemented in the PLD and the signal propagation delay through the ASIC matches the delay through the PLD.

23 Claims, 5 Drawing Sheets

DELAY-MATCHED ASIC CONVERSION OF A PROGRAMMABLE LOGIC DEVICE

TECHNICAL FIELD

The present invention relates generally to programmable integrated circuits, and more particularly to a programmable logic device (PLD) to application-specific-integrated-circuit (ASIC) conversion.

BACKGROUND

Prototyping a complex digital integrated circuit is complex and cost-intensive. As a design evolves and is debugged, circuit details may change. Should the design be embodied in an application specific integrated circuit (ASIC), the changes in design require mask changes and also affect related processing steps, thus requiring costly process changes. By prototyping the circuit using a programmable logic device, a user may debug and evolve the design without worrying about related process step changes that would be required if an ASIC were used to implement the design. But the programmability of a programmable logic device (PLD) comes at the cost of larger silicon die area (to provide the programmable features) as compare to an ASIC implementation. Thus, PLDs are often used during the prototyping stage but later replaced by ASICs as the design matures and production volumes increase.

A number of approaches are currently used to convert a design implemented in a PLD into an ASIC. These PLD-to-ASIC conversion processes all typically suffer from a number of problems. For example, although the ASIC will implement the same logic programmed into the PLD, the propagation delays for various signals within the ASIC will differ from the same delays encountered in the PLD. Because the design was optimized for the PLD delays, performance suffers or the ASIC may simply be inoperable. An additional problem is that an ASIC conversion is specific to a given customer's design. To test the ASIC to verify its design during manufacture thus requires customer-provided test vectors. As a result of the burden of having to provide test vectors, the uncertainty of matching propagations delays, and other problems, many users have been reluctant to use an ASIC conversion despite the opportunity to save production costs.

Accordingly, there is a need in the art for improved ASIC conversions for PLDs that will match propagations delays and eliminate the need for customer-provided test vectors.

SUMMARY

One aspect of the invention relates to an application specific integrated circuit (ASIC) conversion of a programmable logic device (PLD), wherein the programmable logic device comprises a plurality of PLD logic blocks coupled together by a PLD routing structure. The ASIC includes a plurality of ASIC logic blocks corresponding on a one-to-one basis with the plurality of PLD logic blocks; and an ASIC routing structure configured to couple logical inputs to each ASIC logic blocks and to couple logical outputs from each ASIC logic block, wherein the coupling provided by the ASIC routing structure is the same as that provided by the PLD routing structure.

Through customization during manufacture with at least one via or metal mask, the ASIC matches the truth tables and the routing used in the PLD being converted. Because of the one-to-one correspondence between logic blocks in the ASIC and the PLD, the routing between logic blocks in the ASIC is the same as in the PLD. Thus, routing delays may be closely approximated. However, because the ASIC's behavior is fixed rather than configurable as in the PLD, die area is saved, thereby providing lower manufacturing costs.

BRIEF DESCRIPTION OF THE DRAWINGS

Use of the same reference symbols in different figures indicates similar or identical items.

DETAILED DESCRIPTION

Figure 1:
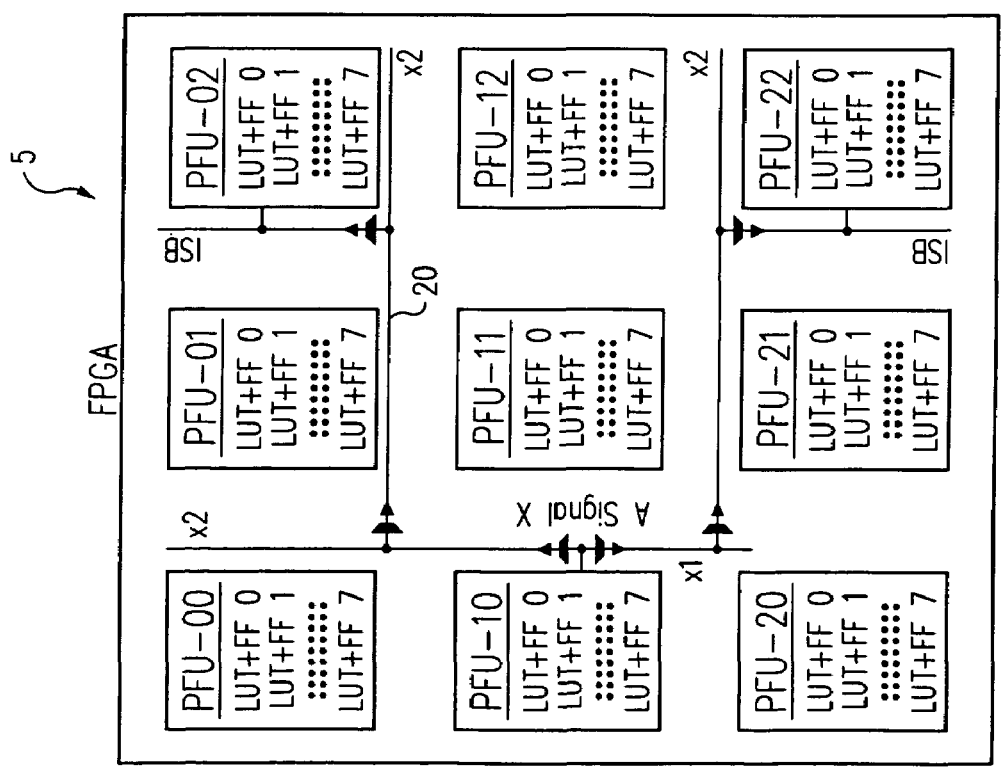
FIG. 1 is a block diagram of a conventional FPGA.

The following discussion will relate to an ASIC conversion of a type of PLD generally denoted as a field programmable gate array (FPGA). However, it will be appreciated the ASIC conversion approach discussed herein is applicable to other types of PLDs such as a complex programmable logic device (CPLD). A block diagram for a conventional FPGA 5 is shown in FIG. 1. FPGA 5 includes a plurality of look-up-table-based logic blocks, designated as programmable function units (PFU). FPGA 5 includes nine logic blocks (PFU-00 through PFU-22). Each logic block includes a plurality of look-up table (LUT) and flip-flop (FF) combinations as is known in the art. In the embodiment illustrated, each logic block includes eight LUT-FF combinations. Each LUT is a four-input (16 bit) LUT whose output may be registered in the accompanying flip-flop. It will be appreciated, however, that the number of LUT-FF combinations in each logic block is arbitrary and will depend upon a particular PLD manufacturer's FPGA design. Similarly, the bit size of each LUT is also arbitrary and depends upon a particular PLD manufacturer's FPGA design. During configuration of FPGA 5, a user will program the truth tables in the LUTs of appropriate logic blocks to implement a desired logical function. A configuration memory (not illustrated) stores the truth tables for the LUTs.

FPGA 5 includes a routing structure to route external inputs to logic blocks and to route outputs from each of logic blocks to other logic blocks or to I/O cells (not illustrated) within the device. As is known in the art, the routing structure is typically controlled by the configuration signals programmed into the configuration memory. Thus, the particular routing determined by the configuration signals is static during operation of the device. In other words, if an output from one PFU is routed as an input to another PFU through the routing structure, such a routing will continue during operation of FPGA 5 until the configuration memory is re-programmed. For illustration clarity, only a portion 20 of the routing structure is shown. Through routing structure portion 20, a logical output from logic block PFU-10 routes as an input to logic blocks PFU-02 and PFU-22.

Figure 2:
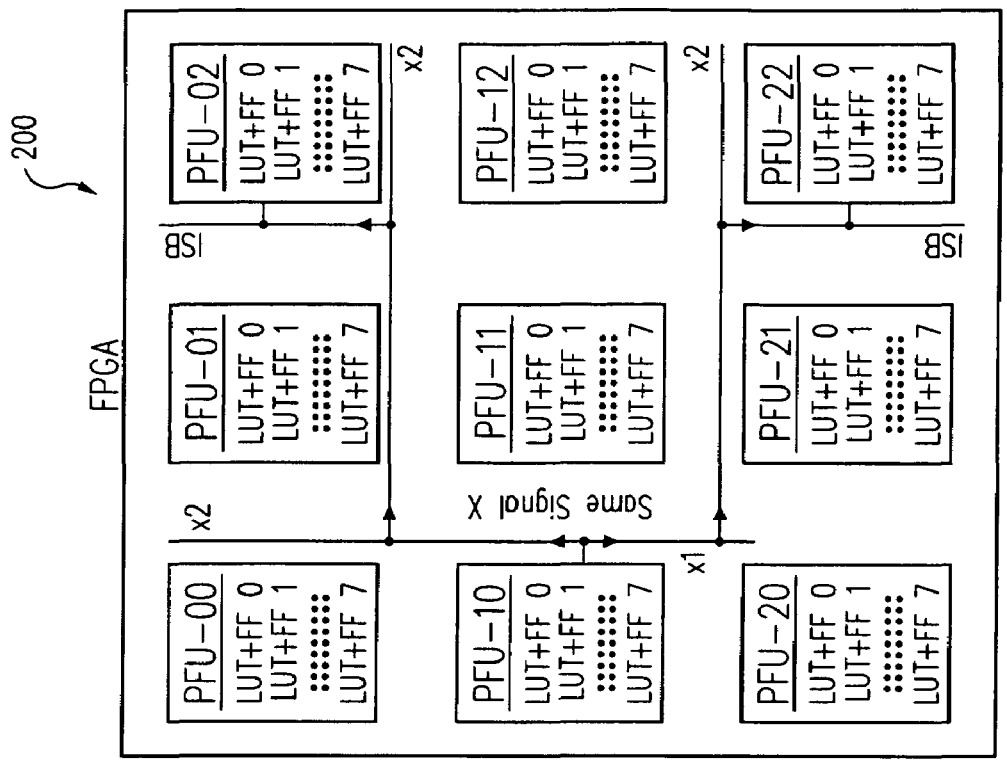
FIG. 2 is a block diagram of an ASIC conversion of the FPGA of FIG. 1 according to one embodiment of the invention.

To avoid the delay matching problems encountered in prior art FPGA conversions, an ASIC for an FPGA conversion as disclosed herein will have the same logic block architecture and placement in the FPGA. For example, ASIC 200 as illustrated in FIG. 2 is an FPGA conversion of FPGA 5. ASIC 200 includes nine converted logic blocks also designated as PFU-00 through PFU-22 to indicate the one-to-one relationship between FPGA logic blocks and converted ASIC logic blocks. Each ASIC logic block PFU-00 through PFU-22 includes eight LUT-FF combinations. The bit size and the truth table programming for the truth tables in the LUTs in both ASIC 200 and FPGA 5 are the same. In general, an ASIC logic block will include whatever number of LUT-FF combinations are included in logic blocks of the FPGA being converted. During manufacture, ASIC 200 is configured with a via or metal mask (preferably just one mask for one metal layer) to incorporate the same truth tables and routing as used in FPGA 5. For example, ASIC 200 would route the same output from PFU-10 to PFU-02 and PFU-22 as discussed with respect to FIG. 1.

Figure 3:
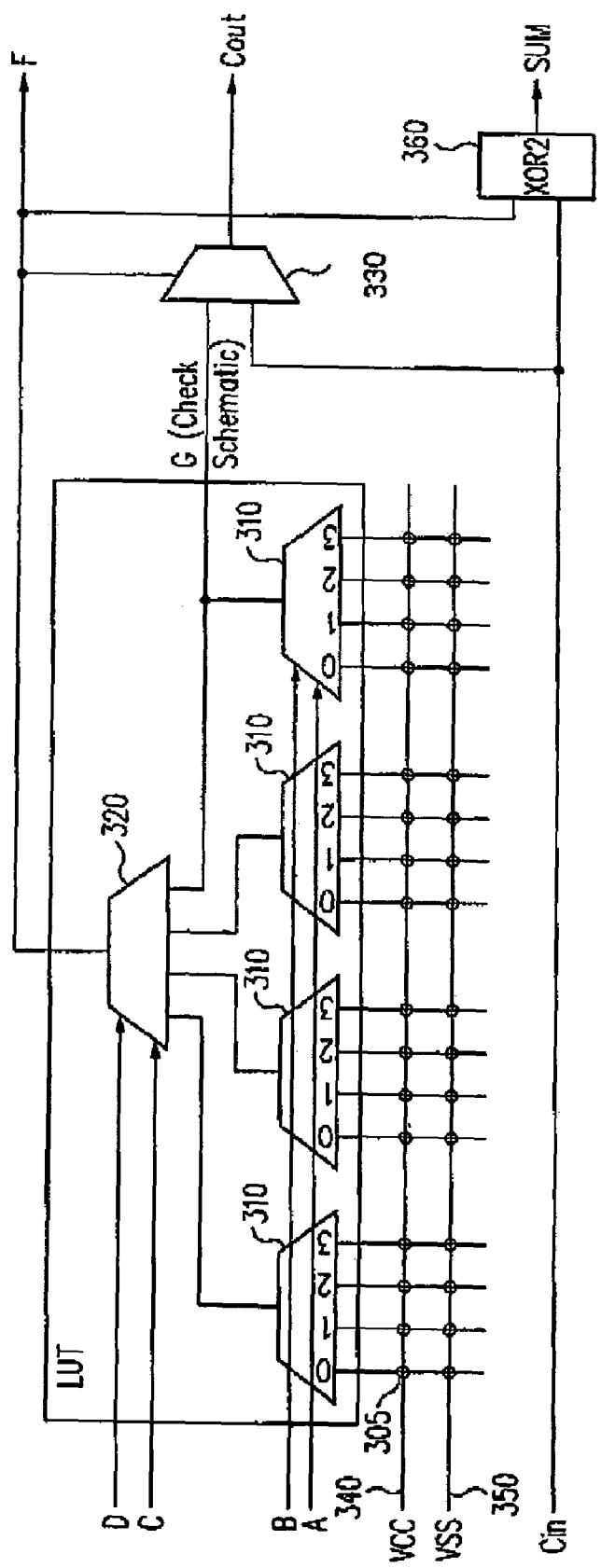
FIG. 3 is a schematic illustration of a lookup table(LUT) for a logic block within the ASIC of FIG. 2.

An exemplary four-input LUT 300 for a logic block within ASIC 200 is shown in FIG. 3. It will be appreciated that the architecture for the LUT being modeled in FPGA 5 will vary according to an individual manufacturer's design. For example, LUT 300 does not include a shift register capability. However, should the LUT being modeled require this capability, LUT 300 would be designed to support it. LUT 300 receives four inputs A,B,C, and D and provides a result that depends upon the desired truth table. This 16-bit truth table matches that in the corresponding LUT in FPGA 5. The binary values in the truth table correspond to either VCC or VSS (ground) in ASIC 200. Should FPGA 5 be a positive logic device (true being high and false being low), a "true" value in the truth table would be tied to VCC whereas a "false" value would be tied to VSS. Alternatively, if FPGA 5 is a negative logic device, a "true" value would be tied to VSS whereas a "false" value would be tied to VCC. Logical inputs A and B control multiplexers 310 that select from values in the truth table. Logical inputs C and D control a multiplexer 320 that selects from the outputs of multiplexers 310 to provide a logical output F.

Figure 4A:
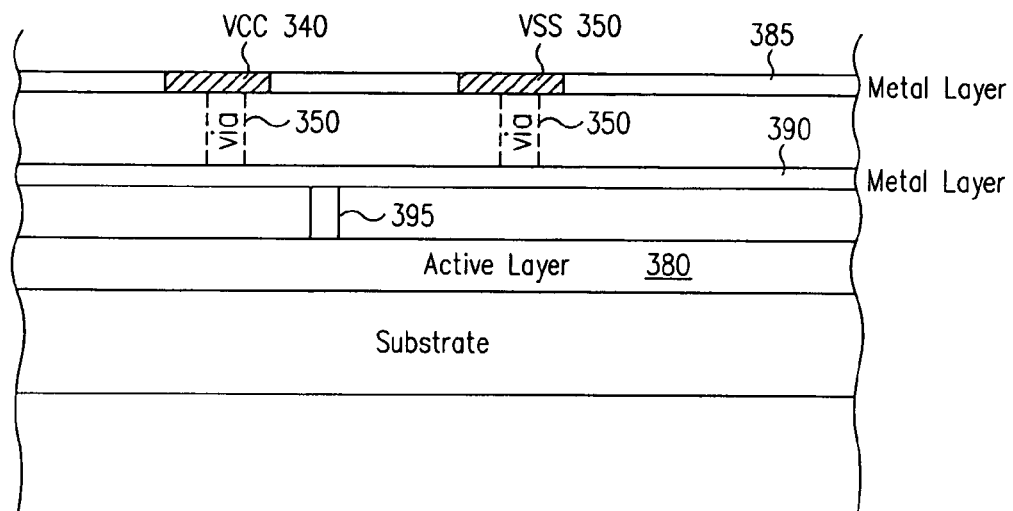
FIG. 4a is a cross-sectional, partially-cutaway view of the ASIC of FIG. 2, wherein the ASIC is customized with a via mask during manufacture.

To configure ASIC 200 so that its logic blocks are programmed with the same truth table as in FPGA 5, permanent connections are made in the logic blocks such as by a via mask customization or a metal layer customization process performed during manufacture. FIG. 4a illustrates a cross-sectional view of ASIC 200 using a via mask customization process. As is known in the semiconductor arts, components such as multiplexers 310 and 320 may be formed in an active layer 380 of a semiconductor wafer used to form ASIC 200 as seen in FIG. 4a. In a separate metal layer 385, traces 340 and 350 carry VCC and VSS, respectively (for illustration clarity, additional layers that would overlay metal layer 385 are not shown). To provide the truth table inputs to multiplexers 310, a set of vias 355 would extend between traces 340 and 350 in metal layer 385 to separate metal layer 390. Traces on metal layer 390 are coupled by other vias 395 to couple the signals to active layer 380. As with the remaining components in ASIC 200, vias 395 would be "hardwired" in that it is just vias 355 that are customized to provide the required truth table. Referring again to FIG. 3, potential via locations 305 are shown between each multiplexer 310 input and both traces 340 and 350. In actual practice, only one of these via locations 305 (for each multiplexer input) would actually be occupied by a via depending upon whether the truth table input should be true or false. A single via mask processing step during manufacture may be used to indicate which trace (340 or 350) should be connected to a via 355. If traces 340 and 350 are not carried on the same metal layer, at least two mask steps would be required, one for each metal layer. LUT 300 also supports a carry-in, carry-out cascade and arithmetic functions through carry-out multiplexer 330 and XOR gate 360.

Figure 4B:
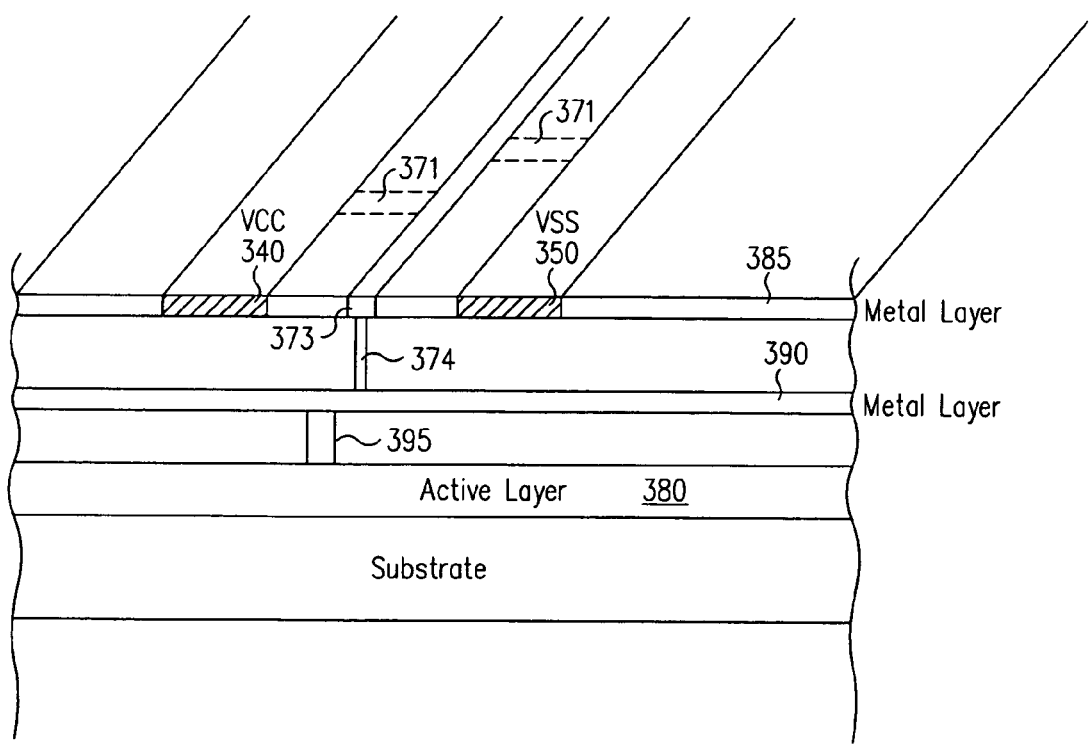
FIG. 4b is a cross-sectional, partially-cutaway view of the ASIC of FIG. 2, wherein the ASIC is customized with a metal layer mask during manufacture.

FIG. 4b illustrates a cross-sectional view of ASIC 200 using a metal layer mask customization process. Traces 340 and 350 carry VCC and VSS in metal layer 385 as described with respect to FIG. 4a. To provide a "true" or "false" input to multiplexers 310 (FIG. 3), either trace 340 or 350 is selectively coupled by a customized trace (or conductor) 371 to trace 375. Vias 374 and 395 then couple trace 375 to a multiplexer input in active layer 380. In this fashion, it is the metal layer 385, rather than the vias, that is customized to provide the proper truth table for LUT 300. Just as with the via mask customization process discussed with respect to FIG. 4a, it is advantageous to require just one metal layer customization process step. In that case, traces 340 and 350 must be carried on the same metal layer. It will be appreciated, however, that traces 340 and 350 do not have to be present in the same metal layer to provide the proper truth table to LUT 300.

Figure 5:
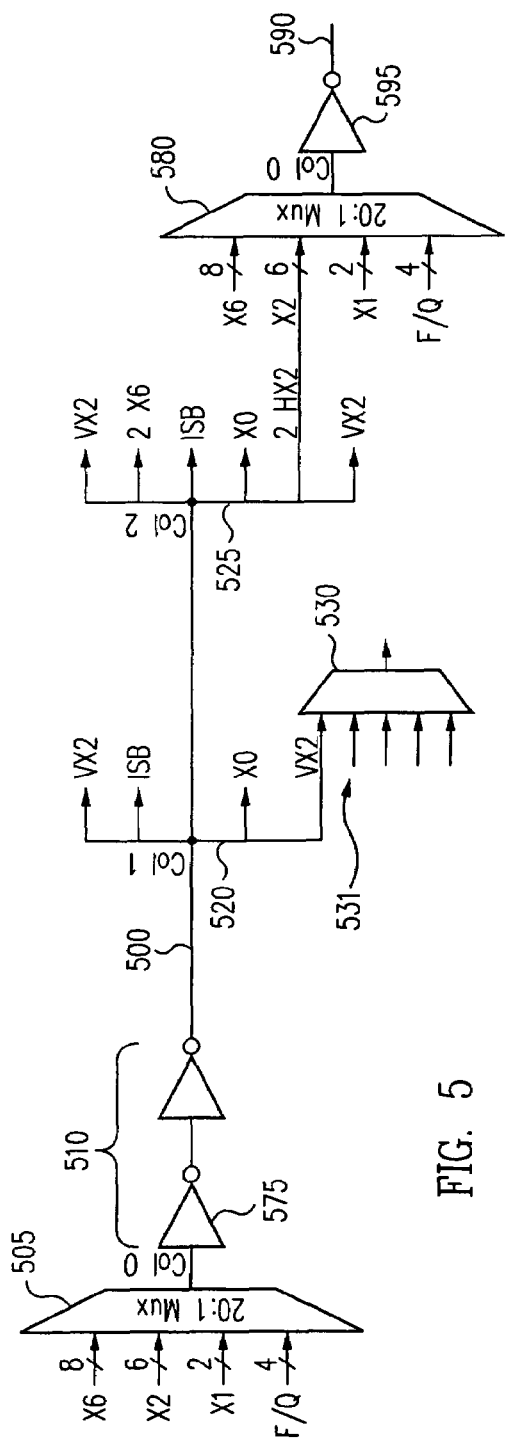
FIG. 5 is a schematic illustration of a portion of the routing structure for the FPGA of FIG. 1.

Just as LUT 300 matches the LUT it is intended to model in FPGA 5, routing in ASIC 200 will also match the routing in FPGA 5. As with the LUT architecture, the routing configuration will be device-dependent and thus will vary according to the particular programmable logic device being modeled. For example, FPGA 5 may have a buffered-segmented routing structure whose segments span a certain number of logic blocks in either a row or column direction. In such a buffered-segmented routing structure, a certain portion of a segmented routing structure may span two rows or columns and thus be denoted as a segment-2 routing resource. Other portions of a segmented routing structure would span more than 2 rows or columns, depending upon the particular design used for the routing structure. FIG. 5 illustrates an exemplary segment-2 routing structure portion 500 for FPGA 5. A 20:1 multiplexer 505 selects from a group of twenty signals to provide an output to be carried on segment-2 routing structure portion 500. Theses signals are carried on four buses denoted as X6, X2, X1, and F/Q. As is known in the art, the selection by multiplexer 505 is controlled by configuration signals. Thus, during operation of FPGA 5, the selection by multiplexer 505 does not change. Also conventional in the art is the use of a buffer 510 to isolate capacitive loading and provide related benefits. Segment-2 routing structure portion 500 spans two columns (of PFUs) such that at each column it fans out to a plurality of outputs. At a first column 520, these outputs are denoted as VX2, ISB, X0, and VX2. At a second column 525, these outputs are denoted as VX2, 2 X6, ISB, X0, 2 HX2, and VX2. To illustrate coupling between segments, a portion of another segment-2 routing portion 590 is shown. Its 20:1 multiplexer 505 selects for one of the HX2 signals from segment-2 routing portion 500 to provide the output onto segment-2 routing portion 590. To model this routing in FPGA 5 into that used in ASIC 200, the same routing delay between segments should be incurred. With respect to FIG.

5, this routing delay may be denoted as that incurred between inverter 575 and inverter 595.

Figure 6:
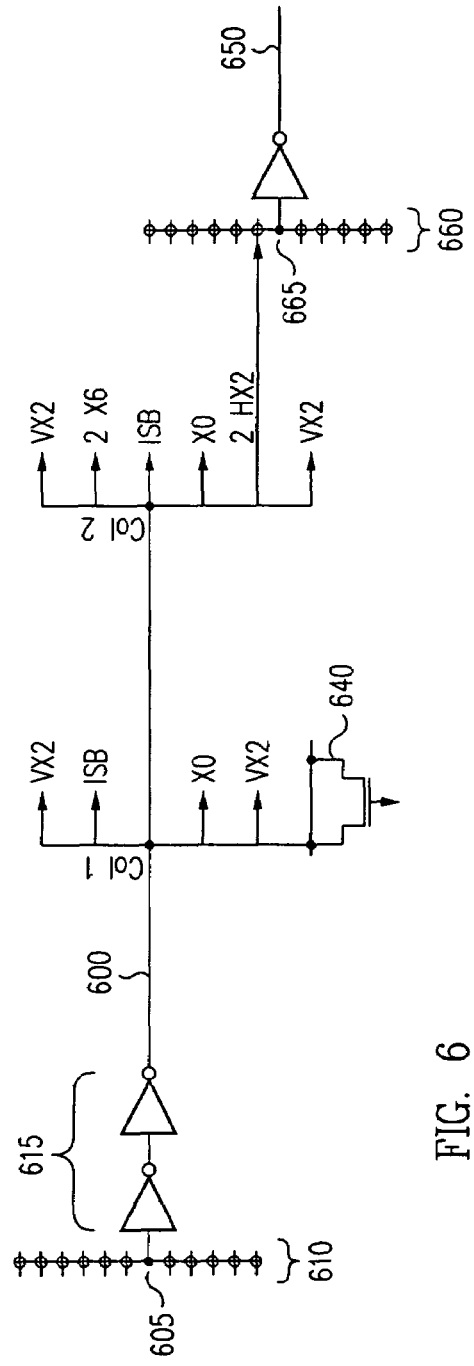
FIG. 6 is a schematic illustration of a portion of the routing structure in the ASIC of FIG. 2 configured to model the routing provided by the routing structure portion shown in FIG. 5.

FIG. 6 illustrates a routing structure portion 600 that models the routing and associated routing delay described with respect segment-2 routing portion 500 of FIG. 5. Busses X6, X2, X1, and F/Q would be carried on the metal layer 385 described with respect to FIGS. 4a and 4b. Analogous to the LUT implementation of FIG. 3, multiplexer 505 is thus modeled by a plurality of potential permanent connections such as via locations 610. Because there are 20 potential signals selected from by multiplexer 505, the same signals in ASIC 200 are carried on traces in metal layer 385. Referring again to FIG. 6, depending upon which signal multiplexer 505 is programmed to select for, the same signal in ASIC 200 is connected by a via 605 to routing structure portion 600. Routing structure 600 supports the same plurality of outputs at each column. To model the routing in FIG. 5, the same connection established by multiplexer 580 is modeled by selecting from potential via locations 660 a via 665 to couple to another routing structure portion 650, which models segment-2 routing portion 590 of FIG. 5.

Although the routing established in the routing segments shown in FIG. 6 models that used in the analogous routing segments of FIG. 5, additional factors affect the actual delay experienced between inverters 575 and 595 of FIG. 5. For example, segment-2 routing portion 500 couples to busses VX2, ISB, and X0 at column one 520. From these busses, connections to other routing segments is possible. Thus, these busses couple to other segments multiplexers's analogously to that shown for multiplexer 505. For example, bus VX2 is shown coupling to another segment's multiplexer 530. Should multiplexer 530 select for another trace, such as trace 531, bus VX2 is affected by capacitive or other types of loading, which is an artifact of fully-decoded multiplexers. In general, selecting one input in such multiplexers adds loading on unselected inputs. With respect to FIG. 5, this loading affects the transmission speed across segment-2 routing portion 500. To model this loading in ASIC 200, bus VX2 at column one could be coupled to a programmable diode load 640 as shown in FIG. 6. This coupling may be effected using a customized via as discussed with respect to FIG. 4a or a customized trace as discussed with respect to FIG. 4b. Programmable diode load 640 is formed in active layer 380 as is the case with other active components in ASIC 200.

Another factor affecting propagation speed in the routing segments used in FPGA 5 is the channel sizes for the transistors used to construct the buffers. Typically, the channel sizes depend upon the particular manufacturing process used to produce FPGA 5—a process that produces relatively wide channels will result in slower propagation speeds as compared to a process that produces relatively thin channels. Even for the same FPGA within a manufacturer's product lineup, these process variations may produce devices ranging from those with relatively fast propagation speeds to those with relatively slow propagation speeds.

Figure 7:
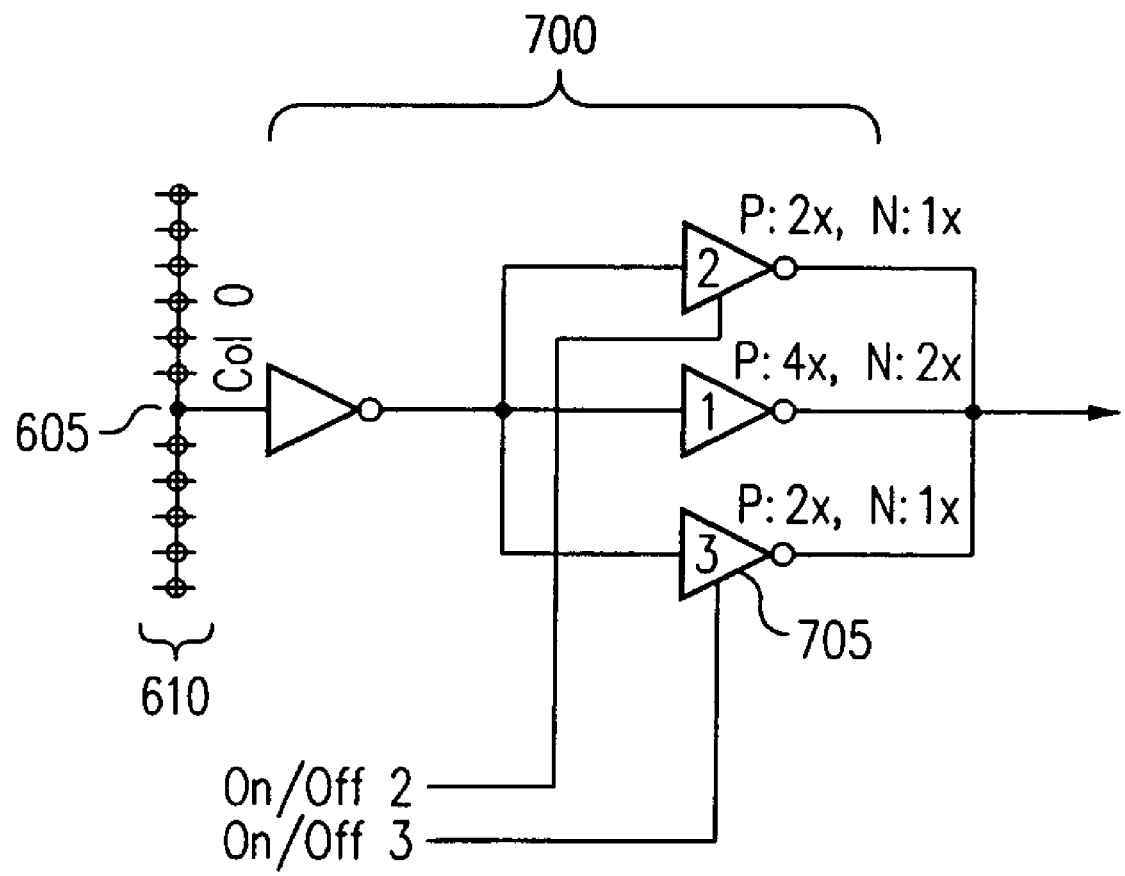
FIG. 7 is a schematic illustration of a programmable buffer embodiment for the routing structure portion of FIG. 6.

To model the potential propagation speed variations for the same product line of programmable logic device, buffer 615 of FIG. 6 in ASIC 200 may comprise a programmable buffer 700 as illustrated in FIG. 7. In such an embodiment, an inverter is replaced by a plurality of inverters 705 arranged in parallel. In the plurality, an individual inverter 705 comprises a "P" and an "N" transistor as is known in the inverter arts. Each inverter 705 has P and N channel dimensions configured according to expected process variation in the FPGA 5 being modeled. These dimensions may be expressed as multiples of a minimum allowable channel width. For example, one inverter 705 may have dimensions of P:4X, N:2X, a second inverter 705 may have dimensions of P:2X, N: 1X, and a third inverter 705 may have dimensions of P:2X, N: 1X as well. In the embodiment illustrated, the first inverter 705 would always be coupled into the propagation path. Depending upon the desired propagation speed, the second inverter 705 and/or the third inverter 705 may also be combined in parallel into the propagation path. The second and third inverters are made conductive or non-conductive responsive to On/Off controls signals 2 and 3, respectively. Should both the second and the third inverter be configured as non-conductive, the propagation speed through buffer 700 would be relatively slow, modeling a slow process used for FPGA 5. As additional inverters are made to become conductive, the propagation speed increases, matching medium and fast processes used for FPGA 5. It will be appreciated, of course, that programmable buffer 700 would be unnecessary in an ASIC conversion of an FPGA that did not employ a buffered, segmented routing structure. On/Off control signals 2 and 3 would couple to all the buffers in the routing segments in ASIC 200. These control signals could then be tied to input pins of the device, allowing a user to select the appropriate propagation speed.

Referring back to FIG. 1, FPGA 5 includes I/O circuitry and I/O pins (both not illustrated) that couple to the routing structure so that signals may be provided to and received from the PFUs by external devices. It will be appreciated that the routing provided by these I/O pins and I/O circuits must also be matched by the ASIC routing structure.

The above-described embodiments of the present invention are merely meant to be illustrative and not limiting. For example, although embodiments of the ASIC conversion device described herein conveniently require a single mask programming step, it will be appreciated that the programmable vias could be implemented between a plurality of greater than two metal layers—for example, between a first and a second metal layer and between the first metal layer and a third metal layer. In such embodiments, multiple mask programming steps would be required corresponding to the different via couplings. Moreover, the ASIC conversion techniques described herein may be applied to logic blocks comprising programmable AND arrays rather than LUT/FF combinations. The via mask or metal layer mask customization step would then be used, among other things, to determine which logical inputs are fused into the AND array. It will thus be obvious to those skilled in the art that various changes and modifications may be made without departing from this invention in its broader aspects. Accordingly, the appended claims encompass all such changes and modifications as fall within the true spirit and scope of this invention.

The invention claimed is:

1. An application specific integrated circuit (ASIC) conversion of a programmable logic device (PLD), wherein the programmable logic device comprises a plurality of PLD logic blocks and a PLD routing structure operable to couple logical inputs to each PLD logic block, comprising:
   a plurality of ASIC logic blocks structurally corresponding on a one-to-one basis with the plurality of PLD logic blocks; and
   an ASIC routing structure configured to couple logical inputs to each ASIC logic block, wherein the coupling provided by the ASIC routing structure is the same as that provided by the PLD routing structure, and wherein the ASIC routing structure is adapted to be delay matched to propagation delays in the PLD routing structure.

2. The ASIC conversion of claim 1, wherein the PLD logic blocks and the ASIC logic blocks are lookup table (LUT)-based logic blocks.

3. The ASIC conversion of claim 1, wherein the PLD logic blocks and the ASIC logic blocks are programmable AND array-based logic blocks.

4. The ASIC conversion of claim 2, wherein the ASIC includes a plurality of metal layers; wherein at least a first metal layer and a second metal layer in the plurality are coupled by vias each selected so as to provide either a logic high or a logic low value to the plurality of ASIC logic blocks to provide the same truth tables as used in the PLD logic blocks.

5. The ASIC conversion of claim 2, wherein the ASIC includes at least one metal layer, wherein traces formed in the metal layer are customized to provide the same truth tables for the ASIC logic blocks as are used in the PLD logic blocks.

6. The ASIC conversion of claim 4, wherein only the first and second metal layers are coupled by vias selected so as to provide either a logic high or a logic low value to the plurality of ASIC logic blocks to thereby provide the same truth tables as in the PLD logic blocks.

7. The ASIC conversion of claim 4, wherein the first metal layer includes traces carrying voltage levels VCC and VSS, and wherein the vias are selected to couple to VCC to provide a logic high value and to couple to VSS to provide a logic low value.

8. The ASIC conversion of claim 1, wherein the ASIC includes a plurality of metal layers, and wherein at least a first metal layer and a second metal layer in the plurality are coupled by vias each selected so that the coupling provided by the ASIC routing structure routing structure is the same as that provided by the PLD routing structure.

9. The ASIC conversion of claim 8, wherein the PLD routing structure is a buffered, segmented routing structure, each buffered PLD routing segment corresponding to an ASIC buffered routing segment, and wherein the vias are each selected so that the coupling provided by the ASIC routing structure is the same as that provided by the PLD routing structure on a segment-by-segment basis.

10. The ASIC conversion of claim 9, wherein the adaptation of the ASIC routing structure to be delay matched comprises, for each ASIC routing segment, a diode load coupled through a via provided between the first and second metal layer to match the propagation delay in the corresponding PLD routing segment.

11. The ASIC conversion of claim 9, wherein the buffers in each PLD routing segment are constructed with transistors having one of a plurality of channel widths, the selected channel width affecting the propagation delay through the buffer, and wherein the adaptation of the ASIC routing structure to be delay matched comprises a plurality of programmable buffers, each programmable buffer operable to match the propagation delay in a corresponding buffer in the PLD routing structure.

12. The ASIC conversion of claim 11, wherein each programmable buffer comprises a plurality of inverters operable to be selectively coupled in parallel.

13. The ASIC conversion of claim 12, wherein the plurality of inverters comprises three inverters.

14. An application specific integrated circuit (ASIC) conversion of a programmable logic device (PLD), wherein the programmable logic device comprises a plurality of PLD logic blocks configured to perform a desired task and a PLD routing structure operable to couple logical inputs to each PLD logic block, comprising:
  a plurality of ASIC logic blocks structurally corresponding on a one-to-one basis with the plurality of PLD logic blocks;
  an ASIC routing structure configured to couple logical inputs to each ASIC logic block, wherein the coupling provided by the ASIC routing structure is the same as that provided by the PLD routing structure, and wherein the ASIC routing structure is adapted to be delay matched to propagation delays in the PLD routing structure; and
  means for configuring the plurality of ASIC logic blocks to perform the desired task.

15. The ASIC conversion of claim 14, wherein the ASIC includes a plurality of metal layers, and wherein the means for configuring the plurality of ASIC logic blocks includes a plurality of vias between at least a first metal layer and a second metal layer, each via being positioned so as to provide either a logic high or a logic low value to an ASIC logic block, the plurality of vias thereby supplying the same truth tables as used in the PLD logic blocks.

16. The ASIC conversion of claim 15, wherein the routing structure in the programmable logic device is a buffered, segmented routing structure, each buffered PLD routing segment corresponding to an ASIC buffered routing segment.

17. The ASIC conversion of claim 14, wherein the means for configuring the plurality of ASIC logic blocks includes a plurality of conductors within at least one metal layer of the ASIC, each conductor being positioned so as to provide either a logic high or a logic low value to an ASIC logic block, the plurality of conductors thereby supplying the same truth tables as used in the PLD logic blocks.

18. An application specific integrated circuit (ASIC) comprising:
  a plurality of logic blocks structurally corresponding on a one-to-one basis with programmable logic blocks of a programmable logic device (PLD); and
  a routing structure corresponding to the programmable routing structure of the PLD but having permanently formed connections therein, the ASIC routing structure adapted to produce a signal propagation delay that matches substantially the signal propagation delay in the corresponding PLD programmable routing structure.

19. The ASIC of claim 18, wherein the permanently formed connections of the ASIC routing structure include selectively formed vias between conductive layers to provide a desired route through the routing structure.

20. The ASIC of claim 18, wherein the permanently formed connections of the ASIC routing structure include selectively formed vias between conductive layers to produce a desired capacitive load on the routing structure.

21. The ASIC of claim 20, wherein the desired capacitive load is provided by a programmable diode formed in a conductive layer.

22. The ASIC of claim 18, wherein the permanently formed connections of the ASIC routing structure include a buffer permanently programmable to provide a desired signal propagation delay through the buffer.

23. The ASIC of claim 22, wherein the programmable buffer comprises a plurality of programmable inverters arranged in parallel.

* * * * *